(12) United States Patent
Nagai

(10) Patent No.: US 6,394,836 B2
(45) Date of Patent: May 28, 2002

(54) TERMINAL CONNECTION STRUCTURE OF FLAT CIRCUIT BELT

(75) Inventor: Kentaro Nagai, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/755,133

(22) Filed: Jan. 8, 2001

(30) Foreign Application Priority Data

Jan. 26, 2000 (JP) .......................................... 2000-017483

(51) Int. Cl.[7] .......................... H01R 11/20; H01R 4/24; H01R 4/26; H01R 4/10; H01R 12/00
(52) U.S. Cl. ........................... 439/422; 439/877; 439/77
(58) Field of Search ........................... 439/422, 42, 877, 439/495, 507, 77, 424

(56) References Cited

U.S. PATENT DOCUMENTS

| | | | | | |
|---|---|---|---|---|---|
| 3,395,381 A | * | 7/1968 | Huffnagle | ...................... | 339/97 |
| 3,924,917 A | * | 12/1975 | Mushower | ................... | 339/17 |
| 3,960,430 A | * | 6/1976 | Bunnell et al. | ................ | 339/97 |
| 4,066,319 A | * | 1/1978 | Baker et al. | ................... | 399/97 |
| 4,082,402 A | * | 4/1978 | Kinkaid et al. | ................ | 339/97 |
| 5,137,468 A | * | 8/1992 | Murakami | ................... | 439/422 |
| 5,195,908 A | * | 3/1993 | Yamamoto et al. | ......... | 439/422 |
| 5,299,954 A | * | 4/1994 | Ishii | .......................... | 439/422 |
| 5,356,308 A | * | 10/1994 | Toba et al. | .................. | 439/495 |
| 6,068,505 A | * | 5/2000 | Sai | .............................. | 439/422 |
| 6,135,779 A | * | 10/2000 | Koch et al. | .................... | 439/42 |

FOREIGN PATENT DOCUMENTS

JP  11-144780  5/1999

* cited by examiner

Primary Examiner—P. Austin Bradley
Assistant Examiner—Edwin A. León
(74) Attorney, Agent, or Firm—Finnegan, Henderson, Farabow, Garrett, & Dunner, L.L.P.

(57) ABSTRACT

A terminal connection structure for a flat circuit belt includes a flexible flat cable (FFC) (21) and a plurality of connection terminals (22) fixed to the end portion of the FFC 21. The FFC comprises a plurality of conductive strips (23) arranged in parallel to each other at a predetermined interval, and a pair of base films (24) sandwiching the conductive films. Each connection terminal corresponds to one of the conductive strip. The connection terminal has a base plate (28) and projections (31) rising from the longitudinal edges of the base plate so as to face each other with the base plate between them. The projections pierce through the associated conductive strip. The tips of the facing projections are bent and caulked each other. Each projection has a groove (31A) in its inner face, and the edges of the conductive film are pressed into the grooves of the facing projections.

12 Claims, 5 Drawing Sheets

TERMINAL CONNECTION STRUCTURE OF FLAT CIRCUIT BELT

The present patent application claims the benefit of earlier Japanese Patent Application No. 2000-17483 filed Jan. 26, 2000, the disclosure of which is entirely incorporated herein by reference.

BACKGROUND OF THE INVENTION

1. Field of the Invention

The present invention relates to a terminal connection structure of a flat circuit belt, such as a flexible flat cable (FFC) or a flexible print-circuit.

2. Description of the Related Art

In general, one or more electric connection terminals are furnished to the end of a flat circuit belt, such as a flat cable, to allow the flat circuit belt to be electrically connected to another circuit. An example of such a connection terminal is disclosed in Japanese Patent Application Laid-open No. 11-144780. FIG. 1 illustrates this type of conventional terminal structure fixed to a flexible flat cable. A conventional connection terminal 3 has a pair of pointed projections 4, which pierce through the conductive film 2 of the flat cable 1 and the insulating layer covering the conductive film 2 all together. The projections 4 are bent inward to form barrels. The penetration of the projections through the conductive film 2 achieves electric connection between the connection terminal 3 and the conductive film 2 of the flat cable 1.

The connection terminal shown in FIG. 1 is generally applied to a wire harness. In this case, the tips of the projections 4 are also caused to pierce through the insulating cover and the conductive film 2 of the flat cable used in the wire harness. The projections 4 sticking out of the top face of the flat cable 1 are then bent inward using a piercing tool so that the tips of the projections 4 dig again into the flat cable, thereby securely holding the flat cable 1.

However, the conventional terminal structure has a problem that the contacts (i.e., the penetrating portion) between the projections 4 and the conductive film 2 has insufficient contact load. For this reason, the contact point or the contact area between the conductive film and the projection easily shifts due to a vibration or a change in temperature. Such unstable contact may cause the contact resistance to increase.

SUMMARY OF THE INVENTION

Therefore, it is an object of the invention to reduce the contact fluctuation caused between the conductive film and the projections of a connection terminal, and to provide a terminal structure for a flat circuit belt having a stable contact resistance and reliable electrical characteristics.

To achieve the object, a terminal structure for a flat circuit belt includes a flat circuit belt and a plurality of connection terminals fixed to the end portion of the flat circuit belt. The flat circuit belt comprises multiple conductive strips arranged in parallel to one another at a predetermined interval, and a pair of base films sandwiching the conductive strips. Each connection terminal corresponds to one of the conductive strip. The connection terminal has a contact at its front end, which is to be connected to another contact of a counterpart connector, and a base plate extending from the trailing end of the contact. The base plate has projections facing each other with the base plate between them and piercing through the associated conductive film of the flat circuit belt. The tips of the projections sticking out of the flat circuit belt are bent inward and caulked each other. The feature of the connection terminal is that a groove is formed in the inner face of the projection, so that the conductive film can get into the groove.

The groove allows the contact area between the conductive film and the projection to increase, and at the same time, it prevents the contact between the conductive strip of the flat belt and the connection terminal from shifting. Consequently, stable and reliable electric contact can be achieved.

The flat belt is waved between the facing projections after each projection pierces through the flat belt, with the edges of the conductive film pressed inside the groove. Since a restoration force is caused in the waved conductive film, the contact load between the conductive film and the groove increases, thereby preventing the contact point or contact area from shifting or separating.

The connection terminal also has a pair of bendable retainers on both sides of the projections along the base plate. Each retainer has a pair of walls rising from the base plate and opposed to each other. The walls of the retainer pierce through the base film of the flat circuit belt at both sides of the associated conductive strip.

The retainers positioned before and behind the projections and prevent a stress from affecting the contact between the projections and the conductive film even if the flat circuit belt is pulled strongly. Accordingly, the reliability of the connection between the flat circuit belt and the connection terminal is improved.

BRIEF DESCRIPTION OF THE DRAWINGS

Other objects and advantages will be apparent from the following detailed description of the invention in conjunction with the attached drawings, in which.

DETAILED DESCRIPTION OF THE PREFERRED EMBODIMENTS

Figure 1:
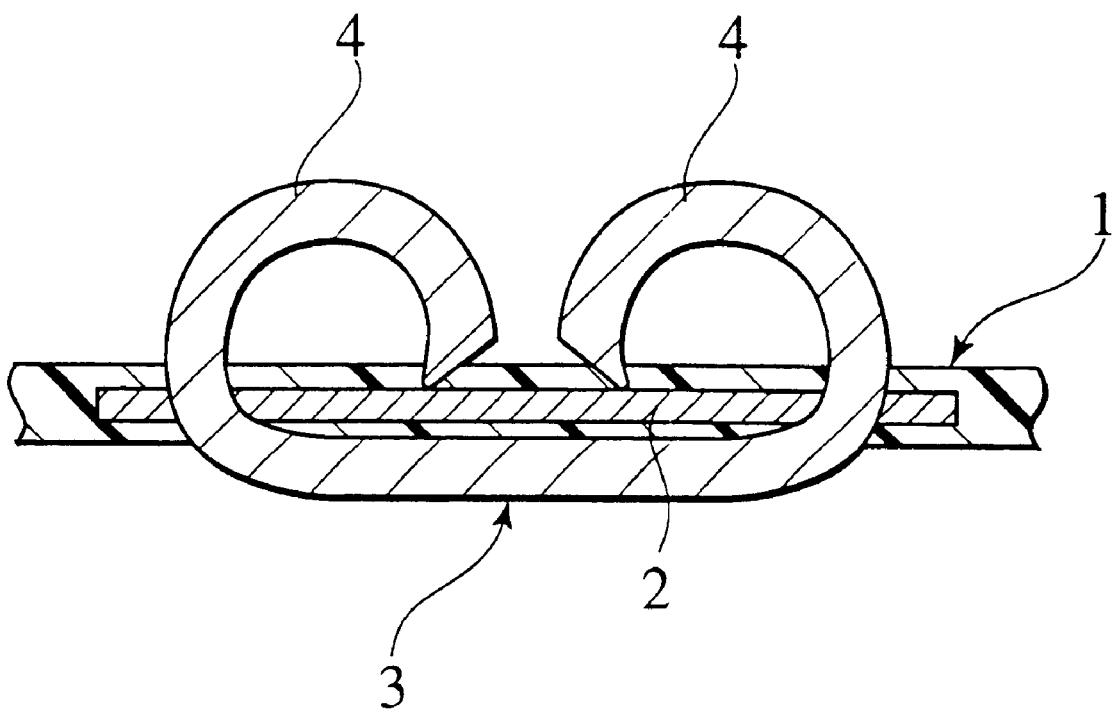
FIG. 1 illustrates the major part of a conventional terminal structure in a cross-sectional view.
Figure 2:
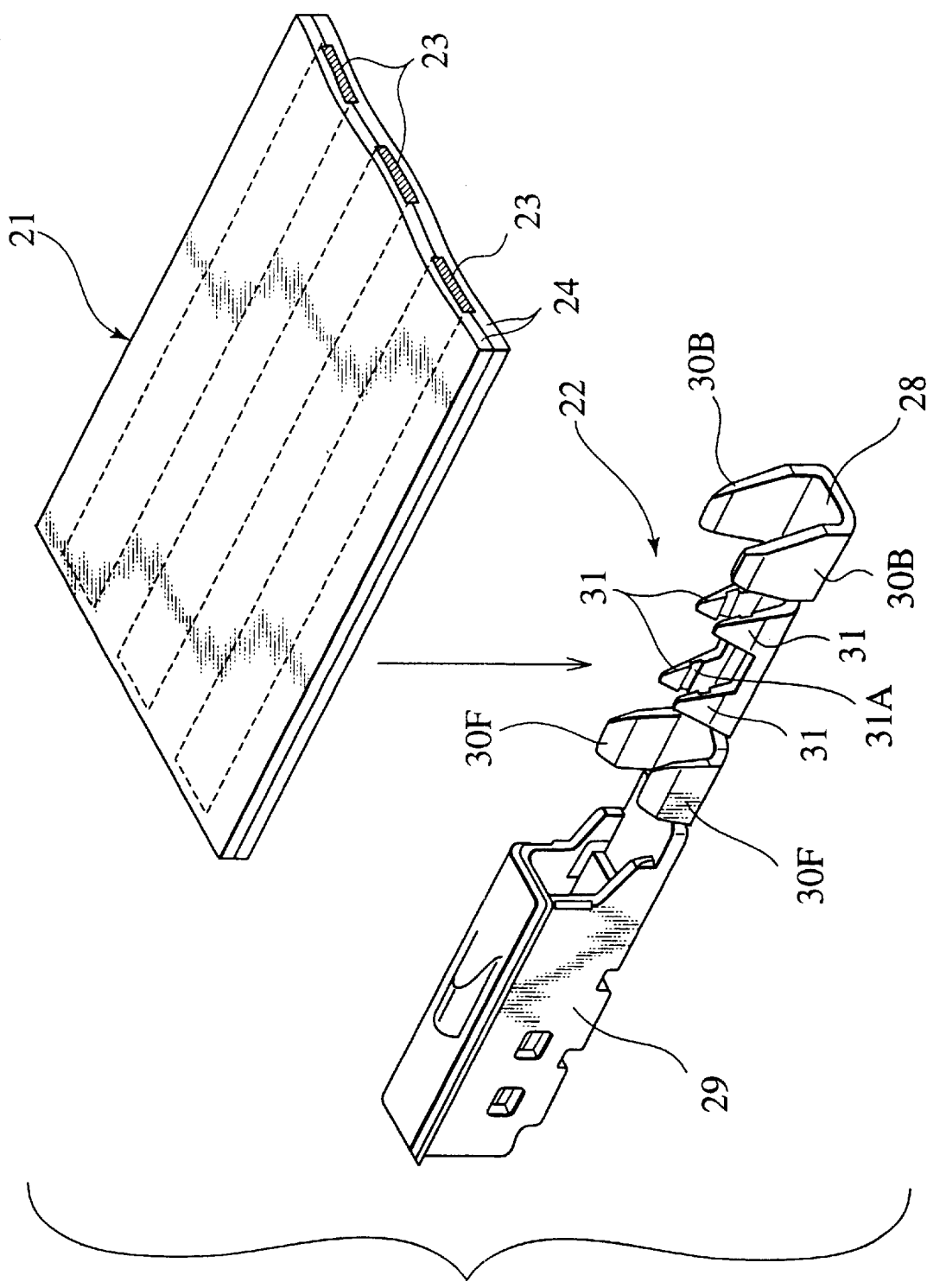
FIG. 2 is an exploded view of the terminal structure for a flat circuit belt according to an embodiment of the invention.

The preferred embodiment of the terminal structure for a flat circuit belt will now be described in detail.

FIGS. 2 through 6 illustrate a terminal structure for a flat circuit belt according to the invention. In the preferred embodiment, the flat circuit belt is a flexible flat cable (FFC).

The terminal structure comprises a FFC 21 and multiple connection terminals 22 attached to the end portion of the FFC 21.

The FFC 21 comprises a plurality of conductive strips, such as rolled copper foils, 23 arranged in parallel to each other at a predetermined interval, and base films 24 sandwiching the conductive strips 23. The base films 24 are stuck to each other by, for example, an adhesive.

The connection terminal 22 has a female contact 29 at the leading end. The female contact is a rectangular shell, which is to receive a male contact of a counterpart connector. A base plate 28 extends from the trailing end of the female contact 29.

The base plate 28 has a pair of bendable retainers 30B and 30F. Each retainer has opposed walls rising from the longitudinal edges of the base plate 28 and facing each other. The first bendable retainer 30F is located closer to the female contact 29, while the second bendable retainer 30B is located at the remote end of the base plate 28. One or more projections (i.e., connection barrels) 31 are positioned between the bendable retainers 30B and 30F. The projections 31 face each other with the base plate 28 between them.

The gap between the facing projections 31 is set narrower than the width of the conductive strip 23, so that the projections 31 can pierce through the conductive strip 23 without fail. The height of each projection 31 is selected such that the projection 31 can pierce through both the base film 24 and the conductive strip 23 of the FFC 21 and the tip of the projection 31 can be bent back toward the top surface of the FFC 31.

Figure 3:
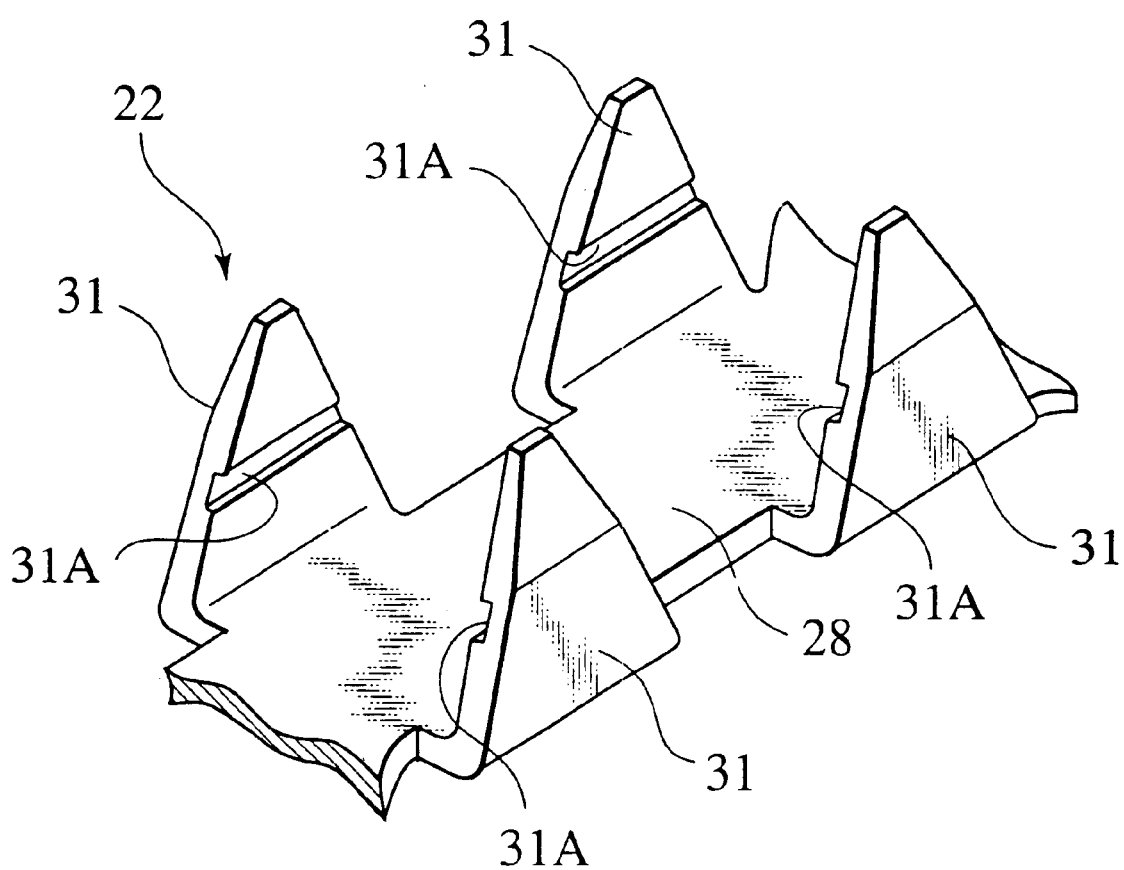
FIG. 3 is a perspective view of the major part of the connection terminal used in the terminal structure shown in FIG. 2.

As a feature of the connection terminal 22, the projection 31 has a groove 31A in its inner face facing the opposite projection 31, as shown in FIGS. 3 and 4. The width of the groove 31A is substantially the same as the thickness of the conductive film 23 of the FFC 21.

The gap between the opposite walls of the bendable retainer 30 is broader than the width of the conductive strip 23. The bendable retainer 30 is higher than the projections 31.

Figure 4A:
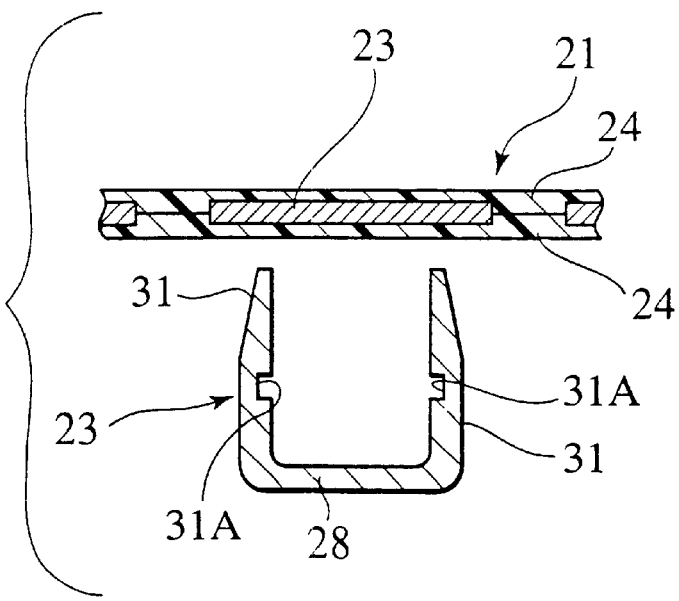
FIG. 4 illustrates the assembling steps of the connection terminal and the flat circuit belt.
Figure 4B:
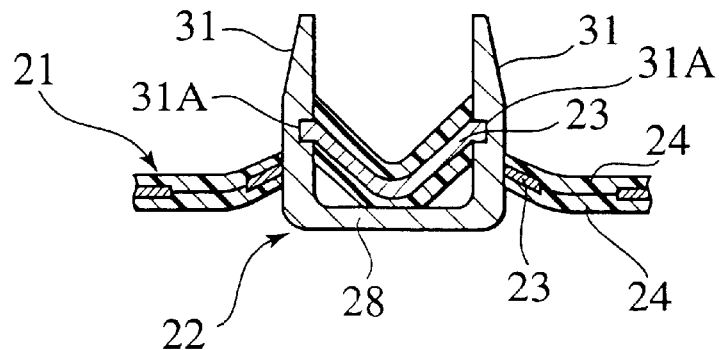

To assemble the connection terminals 22 into the FFC 21 to complete a terminal structure, the FFC 21 is pressed against the base plate 28 of the connection terminal 22. FIG. 4 illustrates how the connection terminal 22 is fixed to the FFC 21. FIG. 4A illustrates the initial position of the projections 31 of the connection terminal with respect to the FFC 21. As the FFC 21 is pressed against the base plate 28, the walls of the retainers 30F and 30B pierce through the layered base films 24 outside the conductive film 23. At the same time, the projections 31 pierce through both the base films 24 and the conductive strip 23 sandwiched by the base films 24, as shown in FIG. 4B. The tips of the projections 31 stick out of the top surface of the FFC 21, and the edges of the conductive strip 23 get into the grooves 31A of the facing projections 31.

Figure 4C:
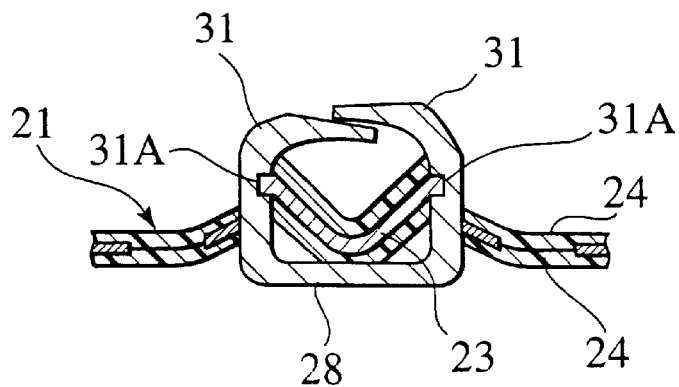

Then, the tips of the projections 31, and the top portions of the walls of bendable retainers 30F and 30B are simultaneously bent inward and caulked using a piercing tool (not shown), as shown in FIG. 4C.

The FFC 21 waves between the facing projections 31, as shown in FIGS. 4B and 4C. The projections 31 function as guaranteeing electrical connection between the FFC 21 and the connection terminal 22. The groove 31A of each projection 31 absorbs the edges of the conductive strip 23, and accordingly, the contact area between the conductive strip 23 and the projection 31 increases. In addition, the waved conductive strip 23 tends to return to the original position, which enhances the mechanical contact between the conducive strive 23 and the projection 31. On the other hand, the bendable retainers 30F and 30B securely hold the FFC 21 before and behind the projections 31.

After the connection terminals 22 are fixed to the FFC 21, the connection terminals 22 are inserted in a connector housing (not shown) to receive counterpart terminals.

With this terminal structure for a FFC, the electric connection between the projections 31 and the conductive strip 23 of the FFC 21 is protected from an external force by the bendable retainers 30B and 30F. Even if the FFC 21 is pulled and a tension is caused, the tension does not affect the contact between the projections 31 and the conductive strip 23. Accordingly, electric connection between the FFC 21 and the connection terminal 22 is guaranteed.

Since the tips of the projections 31 and the walls of the bendable retainers are bent simultaneously, the number of steps required for assembling the FFC 21 and the connection terminal 22 is reduced.

Figure 5:
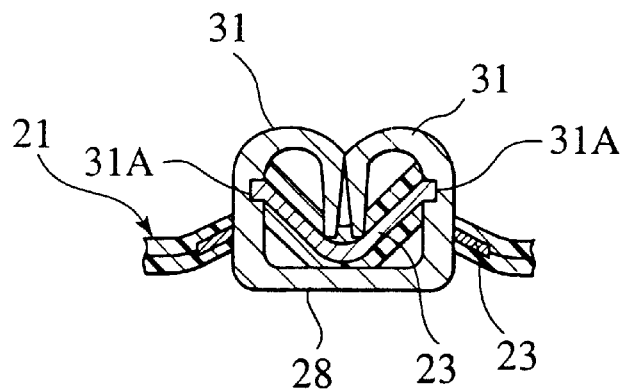
FIG. 5 illustrates a modification of the connection terminal fixed to the flat circuit belt.
Figure 6:
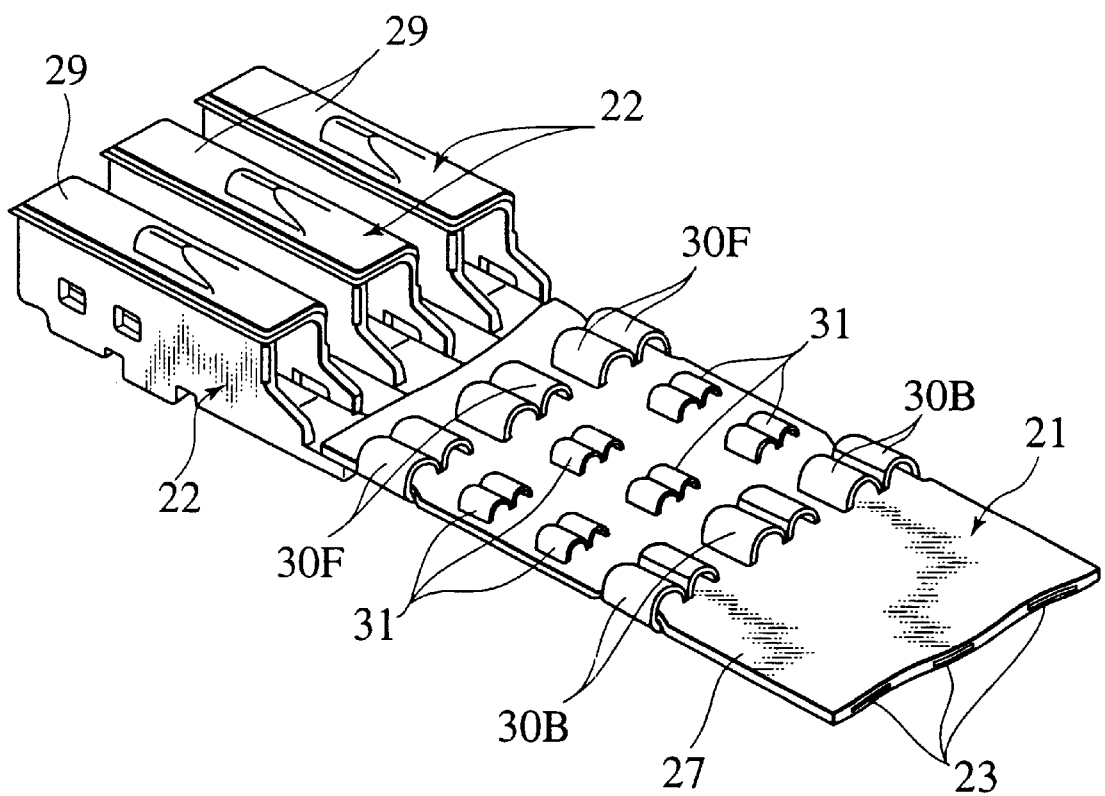
FIG. 6 illustrates a modification of the terminal structure for a flat circuit belt in a perspective view.

FIGS. 5 and 6 illustrate modification of the terminal structure of a FFC 21. In FIG. 5, the tips of the projections 31 are bent back so that the tips pierce through again the upper base film 24 and reach the conductive film 23. In this case, the projections 31 form barrels on the top face of the FFC 21. FIG. 6 illustrates the overall appearance of the terminal structure using the example shown in FIG. 5. The projections 31 form the barrels at positions corresponding to the associated conductive strips and the bendable retainers 30 also form barrels on both sides of the projections 31 so as not to touch the conductive strips. Even if a stress is applied to the FFC 21, electric connection between the barreled projections 31 and the conductive strip 23 is not adversely affected by the stress because of the existence of the retainers 30.

As has been described above, the groove formed in the inner face of the projection receives the edge of the conductive film to increase the contact area between the projection and the conductive film, and to prevent the contact point from shifting. The reliability in electric connection between the FFC 21 and the connection terminal 22 is greatly improved.

The conductive film 23 of the FFC 21, which is waved and pressed against the groove of the projection 31, causes a restoration force, which enhances the contact load between the projection 31 and the conductive film 23. Consequently, undesirable shift or separation of the contact point can be prevented.

Although the invention has been described based on the preferred embodiment, the invention is not limited to the example, and there are many changes and substitutions without departing from the scope of the invention.

For example, the flat circuit belt may be a flexible print circuit (FPC), other than the FFC 21. The contact at the front end of the connection terminal 22 may be of a male type, instead of a female type. Such substitutions are intended to be included in the scope of the invention defined by the appended claims.

What is claimed is:

1. A terminal connection structure comprising:
    a flat circuit belt having a plurality of conductive strips arranged in parallel to each other at a predetermined interval and a pair of base films sandwiching the conductive strips; and
    a plurality of connection terminals fixed to the flat circuit belt so that each connection terminal corresponds to one of the conductive strips, each connection terminal having a contact at a leading end thereof and a base plate extending from a trailing end of the contact, the base plate having longitudinal edges and projections rising from the longitudinal edges thereof, the projections piercing through and forming pierced edges within the corresponding conductive strip, the projections having tips being bent toward the flat circuit belt, each projection having a groove receiving the pierced edge of the corresponding conductive strip, the groove being formed inwardly of an inner surface of the projection.

2. The terminal connection structure of claim 1, wherein each conductive strip is waved between the projections of each connection terminal.

3. The terminal connection structure of claim 1 or 2, wherein each connection terminal further has a pair of retainers positioned along the base plate and on both sides of the projections, each retainer having walls rising from the longitudinal edges of the base plate and piercing through the base films of the flat circuit belt.

4. The terminal connection structure of claim 1 or 2, wherein the flat circuit belt is a flexible flat cable or a flexible print circuit.

5. The terminal connection structure of claim 1 or 2, wherein the tips of the projections are bent and pierce through one of the base films to reach the conductive strips.

6. The terminal connection structure of claim 1, wherein the groove is formed parallel to the base plate.

7. A terminal connection structure comprising:

a flat circuit belt having a plurality of conductive strips arranged in parallel to each other at a predetermined interval and a base film covering the conductive strips; and a plurality of connection terminals, each connection terminal having a base plate and projections extending from longitudinal edges of the base plate, the projections of each connection terminal piercing through and forming pierced edges within a corresponding conductive strip of the flat circuit belt, each projection having a groove receiving the pierced edge of the corresponding conductive strip, the groove being formed inwardly of an inner surface of the projection.

8. The terminal connection structure of claim 7, wherein each conductive strip is waved between the projections of each connection terminal.

9. The terminal connection structure of claim 7 or 8, wherein each connection terminal further has retainers extending from the longitudinal edges of the base plate and piercing through only the base film of the flat circuit belt.

10. The terminal connection structure of claim 7 or 8, wherein the flat circuit belt is a flexible cable or a flexible print circuit.

11. The terminal connection structure of claim 7 or 8, wherein each projection has a tip piercing through the base film and contacting the corresponding conductive strip.

12. The terminal connection structure of claim 7, wherein the groove is formed parallel to the base plate.

* * * * *